(12) United States Patent
Janesick

(10) Patent No.: US 6,762,441 B1
(45) Date of Patent: Jul. 13, 2004

(54) IMAGER CELL WITH PINNED TRANSFER GATE

(75) Inventor: Jim Janesick, Huntington Beach, CA (US)

(73) Assignee: ESS Technology, Inc., Fremont, CA (US)

( * ) Notice: Subject to any disclaimer, the term of this patent is extended or adjusted under 35 U.S.C. 154(b) by 0 days.

(21) Appl. No.: 09/977,444

(22) Filed: Oct. 15, 2001

(51) Int. Cl.[7] .............................................. H01L 29/78
(52) U.S. Cl. ..................... 257/184; 257/221; 257/222; 257/223
(58) Field of Search ............................. 257/184, 221, 257/222, 223, 291, 292

(56) References Cited

U.S. PATENT DOCUMENTS

| | | | | |
|---|---|---|---|---|
| 4,994,875 A | * | 2/1991 | Hynecek | 257/216 |
| 5,077,592 A | * | 12/1991 | Janesick | 257/248 |
| 5,121,214 A | * | 6/1992 | Turko et al. | 348/249 |
| 2002/0121655 A1 | * | 9/2002 | Zheng et al. | 257/291 |
| 2002/0121656 A1 | * | 9/2002 | Guidash | 257/292 |

* cited by examiner

*Primary Examiner*—Minhloan Tran
*Assistant Examiner*—Thomas L Dickey
(74) *Attorney, Agent, or Firm*—Farjami & Farjami LLP

(57) ABSTRACT

An imager cell includes a photoreceptor, a sense node, and a pinned transfer gate. The pinned transfer gate is disposed to transfer charge between the photoreceptor and the sense node. The imager further includes a reset transistor disposed to reset the sense node, and an output amplifier coupled to the sense node. Control circuitry supplies a photoreceptor readout clock to the photoreceptor. The readout clock includes an integration period and a transfer period. During the integration period, the readout clock is at an integration voltage V+ which may be varied to setup a desired charge capacity in the photoreceptor. A thin gate structure or light aperture may be included to enhance blue light response of the photoreceptor. Thus, the imager cell provides improved noise performance, selective charge capacities, and improved blue light response beyond that of conventional imager cells.

5 Claims, 8 Drawing Sheets

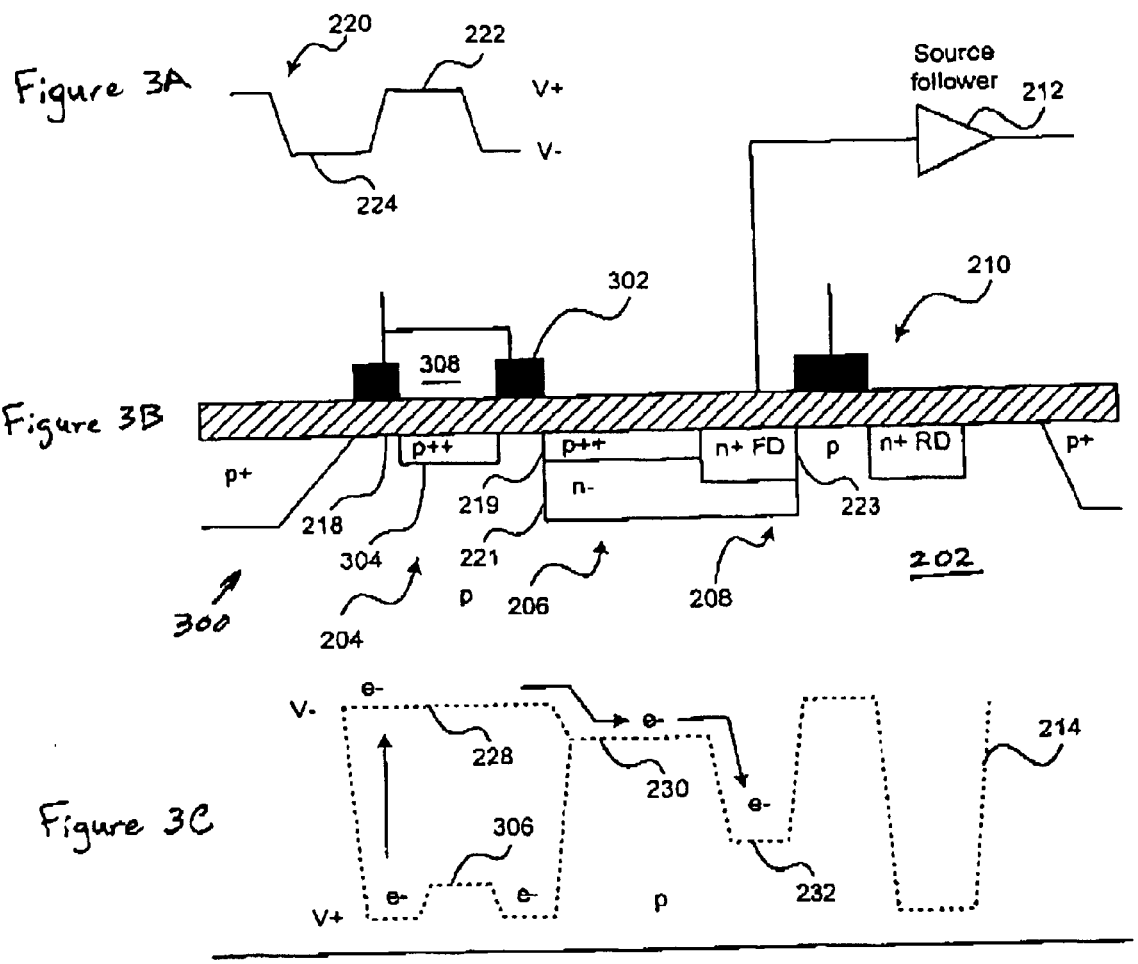

IMAGER CELL WITH PINNED TRANSFER GATE

BACKGROUND OF THE INVENTION

1. Field of the Invention

This invention relates to electronic imaging devices, and in particular to a CMOS imager cell incorporating a "pinned transfer gate".

2. Related Art

Electronic imaging devices ("imagers") find use in a broad range of applications in many distinct fields of technology including the consumer, industrial, medical, defense and scientific fields. Imagers use an array of photoreceptors to convert photons bearing image information into electrical signals representative of the image.

In recent years, CMOS imagers have become a practical implementation option and provide cost and power advantages over other technologies such as charge coupled devices (CCD). A conventional CMOS imager is typically structured as an array of imager cells, each of which includes a photoreceptor approximately reset to a known potential in preparation for integration and readout of an image. The performance of a CMOS imager depends heavily on the performance of the individual imager cells.

In the past, the imager cells took the form of either passive photoreceptor cells, active photoreceptor cells, or transfer gate active photoreceptor cells. The passive photoreceptor cells typically included a photodiode for collecting photocharge and a single access transistor to connect the photodiode to a readout bus. However, passive photoreceptor cells, while having high quantum efficiency, were plagued with high read noise. As a result, imagers began to incorporate active photoreceptor cells. The active photoreceptor cells included a photoreceptor, and either three or four support transistors. The support transistors included a reset transistor, source follower transistor (for buffering and amplifying the collector photocharge), and an access transistor for connecting the photoreceptor to a readout bus. In transfer gate active photoreceptor cells, a fourth transfer gate transistor was used to transfer photocharge from the photoreceptor to a sense node, thereby allowing correlated double sampling, and a corresponding decrease in read and dark current noise.

Active photoreceptor cells, however, exposed far less photoreceptor area to incident light due to the overlying support transistor structures. Furthermore, the n+ contacts used in active photoreceptor cells generated significant dark current, thereby undesirably altering images during integration and readout. In addition, prior photoreceptor cells were not tailored to provide adequate response over a wide range of light levels, nor to blue light in particular.

A need exists for an improved imager cell that addresses the problems noted above and other previously experienced.

SUMMARY

An improved imager cell is arrived at by incorporating a "pinned transfer gate" between a photoreceptor and a sense node. The imager cell may be broadly conceptualized as a light detecting element with low noise characteristics that is configurable for a wide range of charge capacity, for a wide range of light levels, with enhanced blue light response, as compared to conventional imager cell implementations.

One implementation of the imager cell includes a photoreceptor, a sense node, and a pinned transfer gate. The pinned transfer gate is disposed to transfer charge between the photoreceptor and the sense node. As discussed in more detail below, the pinned transfer gate may be a shallow p-doped pinned region in an n-doped transfer region. The photoreceptor, as examples, may be implemented as a photogate or a photodiode, with an accompanying photoreceptor readout gate.

The imager cell may further include a reset transistor disposed to reset the sense node, and an output amplifier (for example, a source follower amplifier) coupled to the sense node. Control circuitry supplies a photoreceptor readout clock to the photoreceptor. The readout clock includes an integration period and a transfer period. During the integration period, the readout clock is at an integration voltage V+ which may be varied to setup a desired charge capacity in the photoreceptor.

Modifications to the imager cell may be included to enhance blue light response. In particular, the photoreceptor may have some gate material removed to form a photoreceptor readout gate light aperture above the photoreceptor (also referred to a "poly hole"). The light aperture allows light to pass directly into the photoreceptor without passing through the gate which absorbs blue photons before they enter the photoreceptor. In addition, dark current performance is enhanced by fabricating a pinned aperture region under the light aperture.

In an alternative implementation, the thickness of the photoreceptor readout gate is adjusted to enhance blue light response of the imager cell. In particular, the photoreceptor readout gate is made relatively thin (also referred to as a "gate"). Generally, the photoreceptor readout gate is less than 2000 Angstroms thick, and may vary depending on considerations which are explained in more detail below.

Related methods of manufacturing the imager cells are discussed below.

The control circuitry associated with the imager cell provides several modes of operation. One mode is a "snap" mode, and another mode is a selective charge capacity mode. In the snap mode, the control circuitry supplies a photoreceptor readout clock simultaneously to a set of photoreceptor readout gates. As a result, accumulated charge in each photoreceptor is transferred to the sense node for each respective photoreceptor in one clock cycle. The snap mode thereby provides a "snapshot" of an image at an instant in time (on the order of one micro-second). In the selective charge capacity mode, the integration voltage V+ is set according to a desired charge capacity for the imager cell.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The components in the figures are not necessarily to scale, emphasis instead being placed upon illustrating the principles of the invention. In the figures, like reference numerals designate corresponding parts throughout the different views.

FIG. 3A shows a diagram of a photoreceptor readout clock.

FIG. 3B shows a PTG pixel with a "poly hole" photoreceptor.

FIG. 3C shows a diagram of a potential well.

DETAILED DESCRIPTION

Figure 1A:
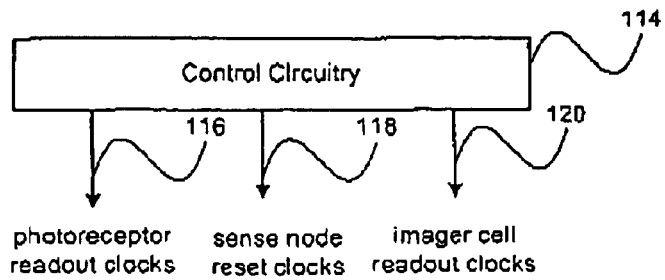
FIG. 1A shows a diagram of an imager cell control and readout circuit.
Figure 1B:
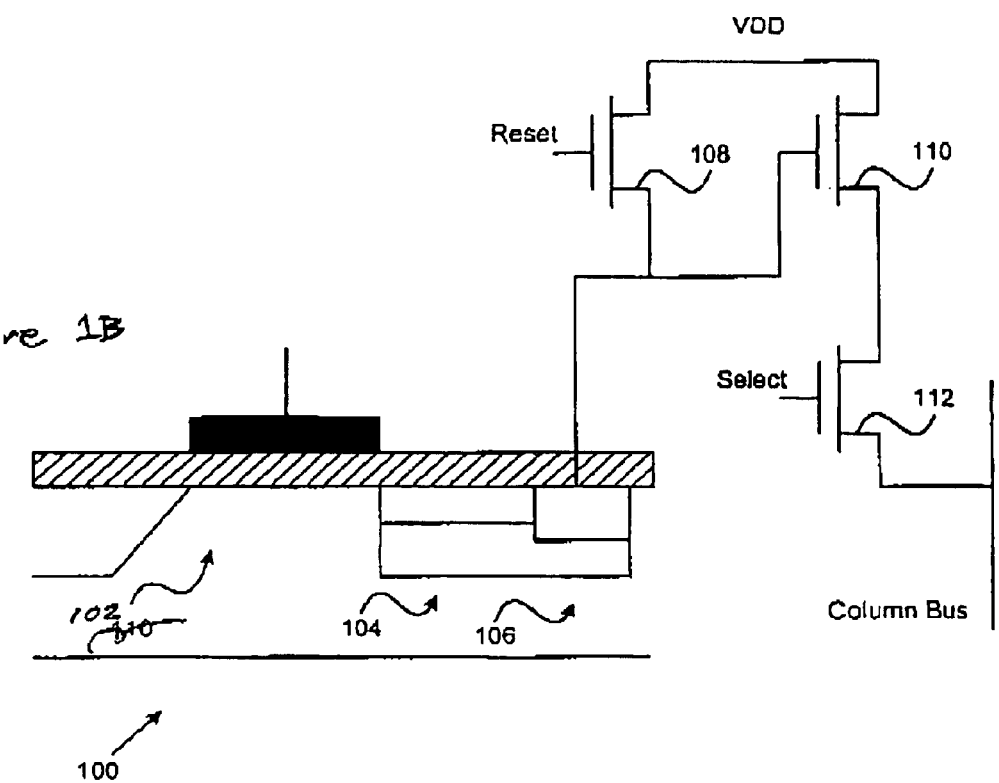
FIG. 1B shows a pinned transfer gate (PTG) pixel.

With regard first to FIG. 1B, an imager cell 100 (described in more detail below) includes a photoreceptor 102, a transfer gate 104, and a sense node 106. A reset transistor 108 is provided to reset the sense node 106, and an output amplifier 110 provides sense node buffering when the sense node 106 is readout to the column bus through the select transistor 112. FIG. 1A shows control circuitry 114, which produces photoreceptor readout clocks 116, sense node reset clocks 118, and imager cell readout clocks 120. The control circuitry 114 may generally be implemented as a conventional CMOS imager controller, except with regard to the operating modes described in more detail below and with regard to the applicable integration voltages that setup preselected charge capacity levels in the photoreceptor 102.

Figure 2A:
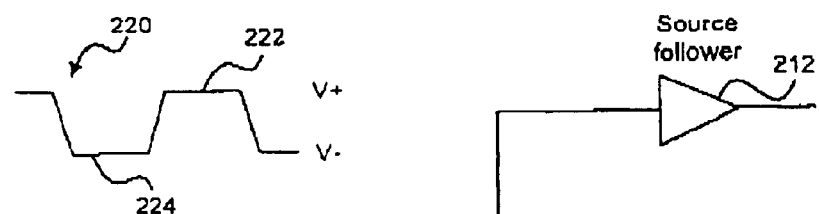
FIG. 2A shows a diagram of a photoreceptor readout clock.
Figure 2B:
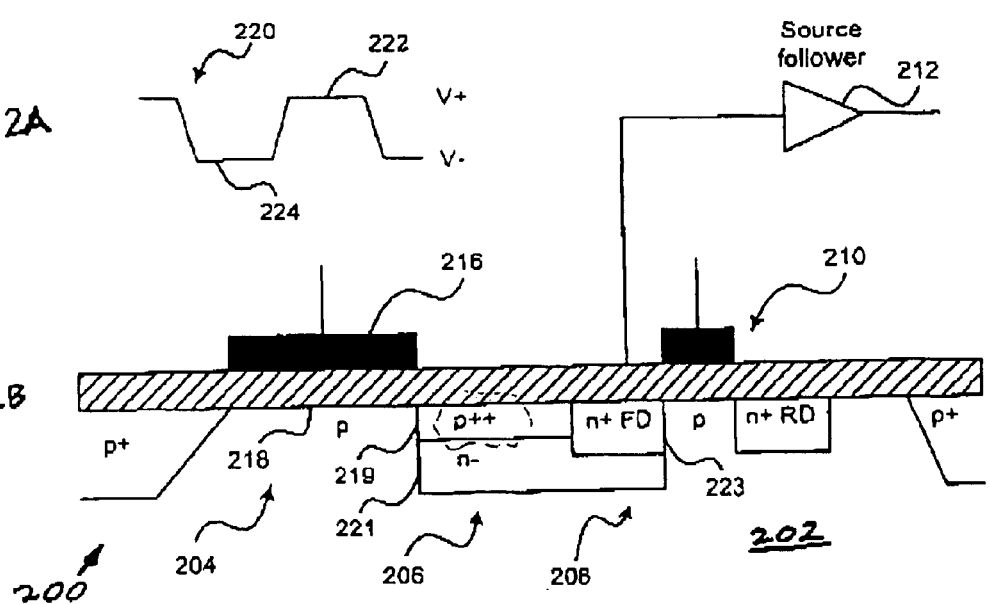
FIG. 2B shows a PTG pixel with a poly photoreceptor.
Figure 2C:
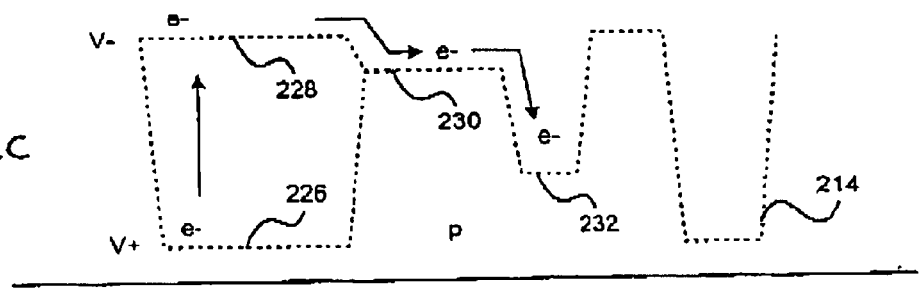
FIG. 2C shows a diagram of a potential well.

Turning next to FIG. 2B, that figure presents a more detailed view of an imager cell 200. The imager cell 200 is formed in a p-type substrate 202 and includes a photoreceptor 204, pinned transfer gate 206 and sense node 208. A reset transistor 210 provides a mechanism for resetting the sense node 208 to an initial level, while the source follower output amplifier 212 provides sense node 208 output buffering and amplification As shown in FIG. 2C, a potential well diagram 214 illustrates the variation in electric potential across the imager cell 200.

As shown in FIG. 2B, the photoreceptor 204 is formed as a "poly photogate" including a photoreceptor readout gate 216, supporting photoreceptor gate oxide 218, and the p-type substrate 202. Other implementations of photoreceptors are also suitable however, including photodiodes.

The pinned transfer gate 206 is formed from a shallow p++ implanted pinned region 219 in an n-implanted transfer region 221 in the p-type substrate 202. The sense node 208 is formed from an implanted n+ contact region 223 and p-type epitaxial substrate 202. Note that the pinned transfer gate 206 is disposed between the photoreceptor 204 and the sense node 208 in order to transfer charge between the photoreceptor 204 and the sense node 208. Note also that the pinned transfer region omits a transistor gate structure (e.g., such as the photoreceptor readout gate 216 provided for the photoreceptor 204). Instead, the pinning sets up a potential well profile that allows charge to transfer through the pinned transfer gate 206 depending on the photoreceptor readout clocks 116 as will be discussed in more detail below.

The pinned transfer gate is "pinned" because the p++ doped pinned region 219 is tied (or "pinned") to the potential of the substrate 202, typically ground or zero volts. Pinning the transfer generally suppresses dark current, which leads to an improved signal to noise ratio because fewer dark current electrons (i.e., noise electrons) contribute to the output signal.

The operation of the photoreceptor 200 in FIG. 2B is discussed with reference to the potential well diagram 214 in FIG. 2C and the photoreceptor readout clock 220 in FIG. 2A. Note that the photoreceptor readout clock 220 varies between a V+ level during an integration period 222 and a V– level during a readout period 224. The duration of the integration period 222 and the readout period 224 vary in accordance with the desired operating speed of the photoreceptor 200. In one implementation, for example, the duration of the integration period 222, may be approximately 1 second, while the duration of the readout period 224 may be approximately $1/30^{th}$ of a second.

Note that during the integration period 222, the integration voltage V+ establishes the integration potential, well 226 in the substrate 202. At this time, photons incident on the photoreceptor 202 produce electrons that are captured in the integration potential well 226. The extent of the integration potential well 206 varies with the integration voltage V+, and may be selected from one of many integration voltages chosen to setup charge capacity levels in the photoreceptor 202.

As the integration voltage V+ increases, so does the charge capacity level for the photoreceptor 202. Thus, during conditions of bright light, for example, the integration voltage V+ may be increased to enhance the charge collection capacity level in the photoreceptor 202 (and thereby reduce blooming or washout, as examples). On the other hand, when low light levels exist, the integration voltage may be decreased, if desired, to setup a correspondingly smaller charge collection capacity in the photoreceptor 202. To that end, the control circuitry 114 may be preprogrammed with a selection of integration voltages to selectively apply to the photoreceptor readout gate 216.

After the integration period 222, the control circuitry 114 applies the readout voltage V– to establish the readout potential well 228. Note that the readout potential well 228 is shallower than the transfer potential well 230, established by the pinned transfer gate 206. As a result, electrons captured by the integration potential well 226 propagate through the transfer potential well 230 and into the sense node potential well 232.

Under control of the imager cell readout clock 120 (which may activate, for example, the select transistor 112), the source follower 212 amplifies and buffers the resultant potential at the sense node 208 onto the column bus. After readout, the reset gate 210 activates under control of the sense node reset clock 118 to approximately reset the sense node 208 to a known potential. In other words, the control circuitry 114 may implement "progressive scanning" to readout one line of imager cells at a time.

The imager cell 200 may also operate in what is referred to as a "snap" mode. During the snap mode, the control circuitry 114 asserts the photoreceptor readout clocks 116 for multiple lines of imager cells 200 simultaneously. The result is that the charge collected in a set of photoreceptors 202 is simultaneously transferred into the sense nodes 208 of the respective photoreceptors 202. The snap mode thus provides a snapshot at an instant in time of the charge collected in the set of photoreceptors 202 to obtain image information undisturbed by noise arising during, for example, a sequential readout process.

As an example, numerous imager cells 200 may be organized into an array to form a CMOS imager. Two or more imager cells 200 may then be selected as a set of photoreceptors 202 for the next snap operation. As examples, the set may include all the photoreceptors 202 that form a rectangular sub-array in the center of the CMOS imager, a stripe of predetermined width vertically through the center of the CMOS imager, or every other imager cell 200 in the CMOS imager.

Turning next to FIG. 3B, that figure shows an implementation of an imager cell 300 employing a poly-hole gate 302 and an optional p++ pinned aperture region 304 (with a corresponding integration potential well 306, which is shown in FIG. 3C, in the substrate 202 in FIG. 3B). The operation of the imager cell 300 with regard to the photoreceptor readout clock 220 shown in FIG. 3A is substantially similar to that described above in FIG. 2A with regard to the imager cell 200 in FIG. 2B. Note, however, that the imager cell 300 provides enhanced response to blue light because the photoreceptor readout gate 216 has had material removed to form the photoreceptor readout gate light aperture 308 above the photoreceptor 204. As a result, many photons impinge up the photoreceptor 204 without passing through polysilicon gate material. Because blue photons tend to be absorbed when passing through polysilicon gate material, the light aperture 308 allows more blue photons to reach the photoreceptor 204. The imager cell 300 has correspondingly increased response to blue light Note also that a micro-lens (not illustrated) focused on the "poly hole" region may be provided above the light aperture 308 to help focus photons into the photoreceptor 204.

As noted above, the p++ pinned aperture region 304 may optimally be fabricated in the photoreceptor 204. The pinned aperture region 304 (like the pinned transfer gate 206) is tied to the substrate 202 potential. As a result, the pinned aperture region 304 decreases the dark noise generated in the photoreceptor 204 and improved image quality results. Furthermore, the gate oxide 218 in the exposed pinned aperture region 304 optionally carries an anti-reflective coating formed from, as an example, 100 Angstroms of oxide and 250 Angstroms of silicon nitride. The anti-reflective coating reduces reflection loss.

Figure 4A:
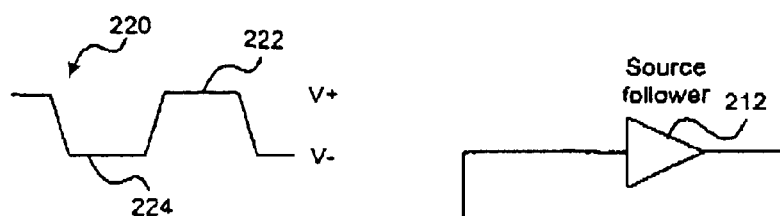
FIG. 4A shows a diagram of a photoreceptor readout clock.
Figure 4B:
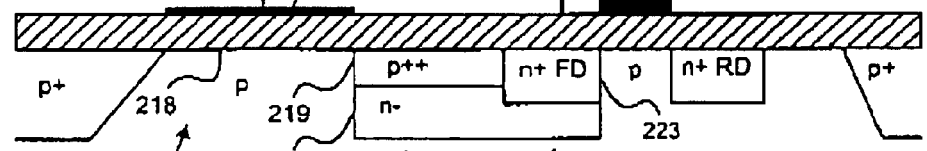
FIG. 4B shows a PTG pixel cell with a "thin gate" photoreceptor.

FIG. 4B presents an additional implementation of an imager cell 400. The imager cell 400 includes a thin photoreceptor readout gate 402. The imager cell 400, like the imager cell 300, provides increased sensitivity to blue light Generally, a photoreceptor readout gate more than 2000 Angstroms thick absorbs significant amounts of blue light. Thus, the thin photoreceptor readout gate 402 is fabricated generally 2000 Angstroms or less in thickness, for example between 50 and 2000 Angstroms. However, the thickness of the thin photoreceptor readout gate 402 may also be varied in accordance with the charge capacity desired in the photoreceptor (which depends on the voltage applied to the photoreceptor readout gate during integration). For example, for 3.3 volt operation a gate thickness of 50–65 Angstroms may be used, while for 5.0 volt operation a gate thickness of 100–110 Angstroms may be used.

Figure 4C:
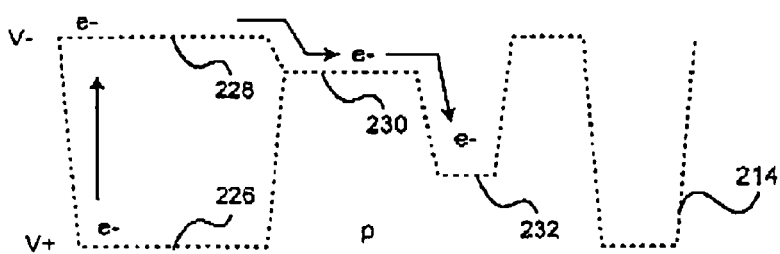
FIG. 4C shows a diagram of a potential well.

The operation of the imager cell 400 with regard to the photoreceptor readout clock 220 in FIG. 4A is similar to that described above in FIG. 2A with regard to the imager cell 200 in FIG. 2B. Also, the variation in electric potential across the imager cell 400 shown in FIG. 4C is similar to that described above in FIG. 2C with regard to the imager cell 200 in FIG. 2B.

Figure 5:
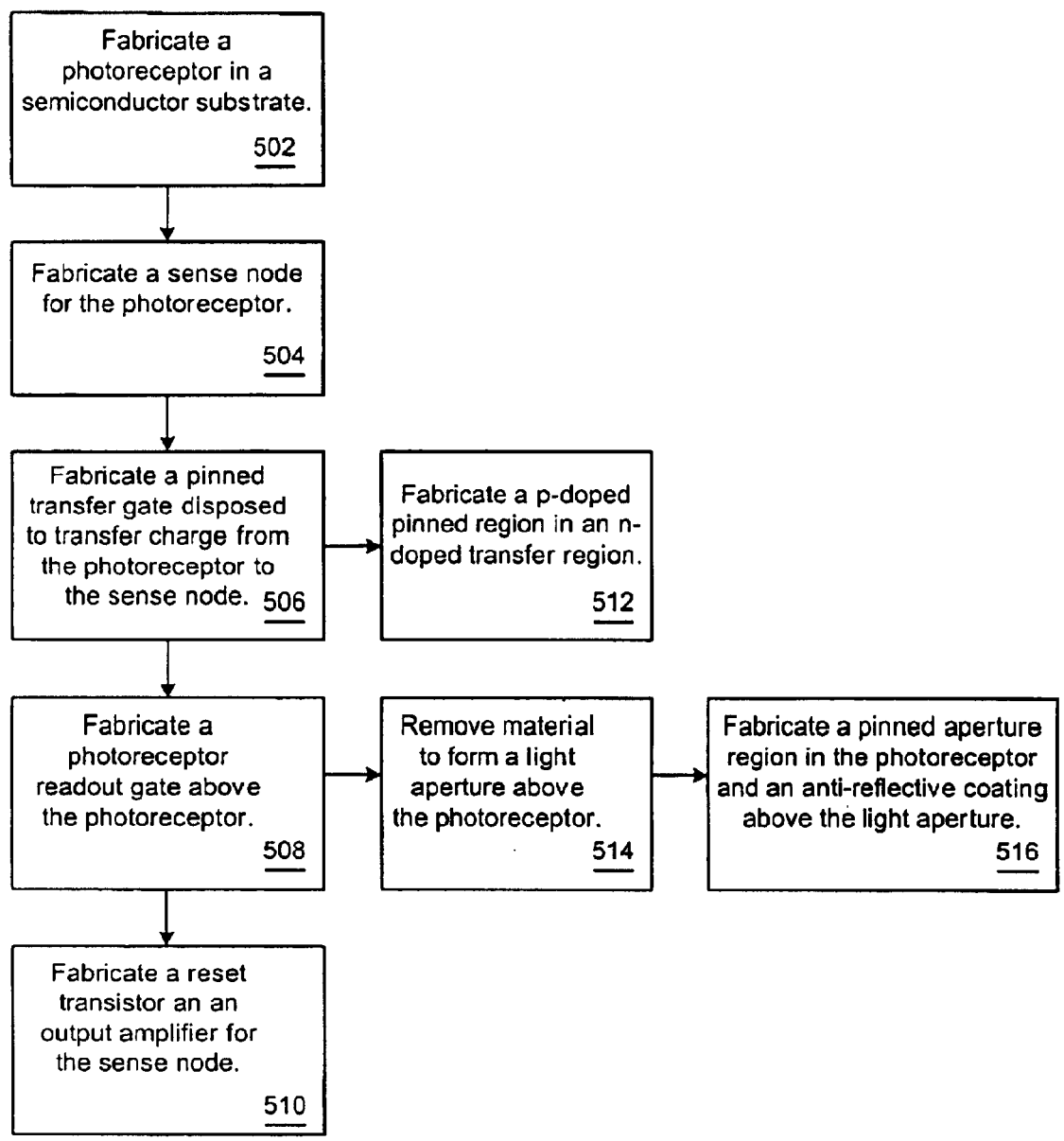
FIG. 5 depicts a method of fabricating an imager cell.

Turning next to FIG. 5, a flow diagram illustrates a method 500 for fabricating an imager cell. The method 500 fabricates (502) a photoreceptor 204, fabricates (504) a sense node 208, and fabricates (506) a pinned transfer gate 206 disposed to transfer charge from the photoreceptor 204 to the sense node 208. Generally, the photoreceptor 204, sense node 208, and pinned transfer gate 206 (and other imager cell structures) are not created sequentially. Rather, using established fabrication processes, portions of the imager cells may be fabricated in the same fabrication process step (e.g., a p-doping step).

In addition, the method 500 fabricates (508) a photoreceptor readout gate, e.g., 216, above the photoreceptor 204. As discussed above with regard to FIG. 4B, the photoreceptor readout gate may be fabricated with a thickness of less than 2000 Angstroms, for example, 400 Angstroms. The method 500 also fabricates (510) a reset transistor 108 and an output amplifier 110 for the sense node 208. Note that the pinned transfer gate 206 is generally fabricated (512) as a p-doped pinned region in an n-doped transfer region. As discussed above with regard to FIG. 3B, the method 500 may fabricate (512) a light aperture 308 above the photoreceptor 204, as well as fabricate (514) a pinned aperture region 304 in the photoreceptor 204 and an anti-reflective coating above the photoreceptor 204.

Figure 6:
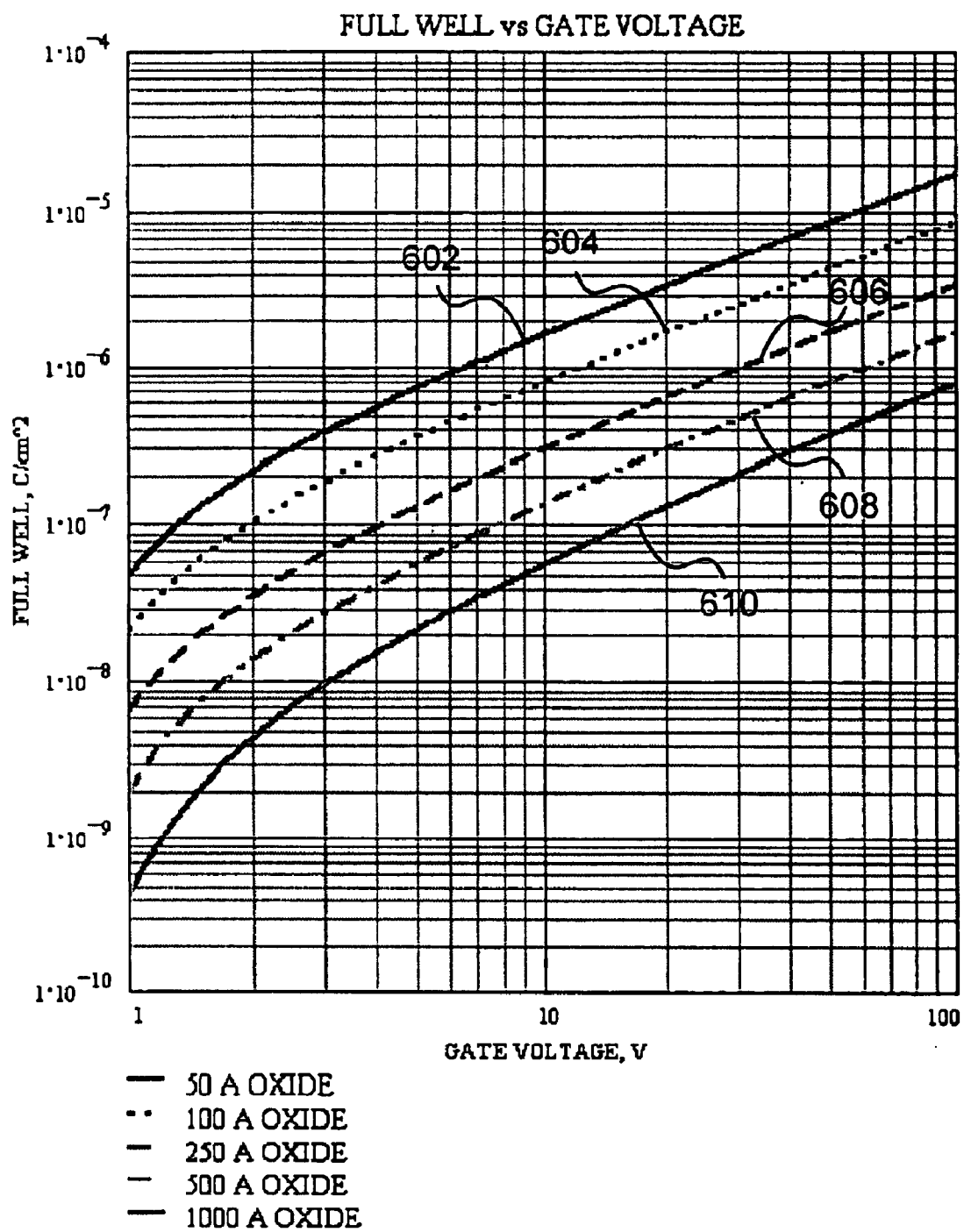
FIG. 6 shows a plot of fill well curves as a function of integration voltage for 10-ohm silicon.

With regard next to FIG. 6, a plot 600 illustrates full well curves 602–610 (i.e., charge capacity levels) in units of Coulombs per square centimeter as a function of integration voltage V+. The model giving rise to FIG. 6 assumes 10-ohm silicon, a transfer gate barrier of 0.4 V, and a thermal barrier of 0.3 V. Curve 602 represents the full well curve for 50 Angstroms of photoreceptor gate oxide 218, curve 604 represents the full well curve for 100 Angstroms of photoreceptor gate oxide 218, and Curve 606 represents the full well curve for 250 Angstroms of photoreceptor gate oxide 218. Similarly, curve 608 represents the fill well curve for 500 Angstroms of photoreceptor gate oxide 218, and curve 610 represents the full well curve for 1000 Angstroms of photoreceptor gate oxide 218. Thus, for example, for 50 Angstroms of photoreceptor gate oxide 218, the full well is $2 \times 10^{-7}$ C/cm$^2$.

Figure 7:
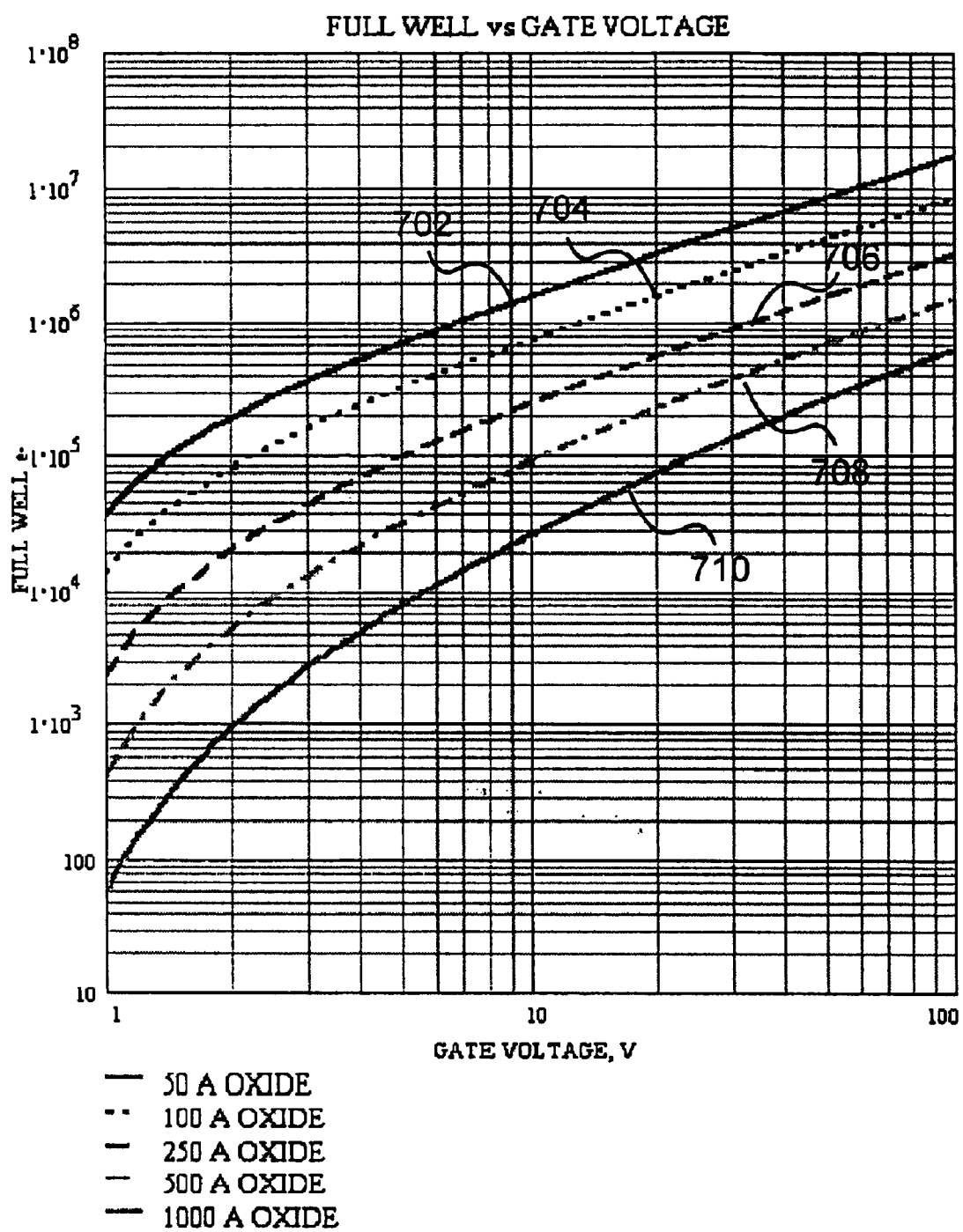
FIG. 7 shows a plot of full well curves as a function of integration voltage for 1-ohm silicon.

FIG. 7 provides a similar plot 700 of full well curves 702–710 (i.e., charge capacity levels) for 1-ohm silicon. The plot 700, however, is shown in units of electrons assuming a 4 micron×4 micron collection region for the photoreceptor 204. Curve 702 represents the full well curve for 50 Angstroms of photoreceptor gate oxide 218, curve 704 represents the full well curve for 100 Angstroms of photoreceptor gate oxide 218, and curve 706 represents the full well curve for 250 Angstroms of photoreceptor gate oxide 218. Similarly, curve 708 represents the full well curve for 500 Angstroms of photoreceptor gate oxide 218, and curve 710 represents the full well curve for 1000 Angstroms of photoreceptor gate oxide 218.

Thus, the imager cells provide enhanced performance light sensors. The imager cells have improved noise performance and improved blue light response using a thin gate or light aperture. The control circuitry for the imager cells supports a snap mode for providing a snapshot at an instant in time of the charge collected in a set of photoreceptors to obtain image information undisturbed by noise. Furthermore, the control circuitry provides a selective charge capacity mode in which the desired charge capacity of a photoreceptor may be setup by choosing an appropriate integration voltage V+.

Figure 8:
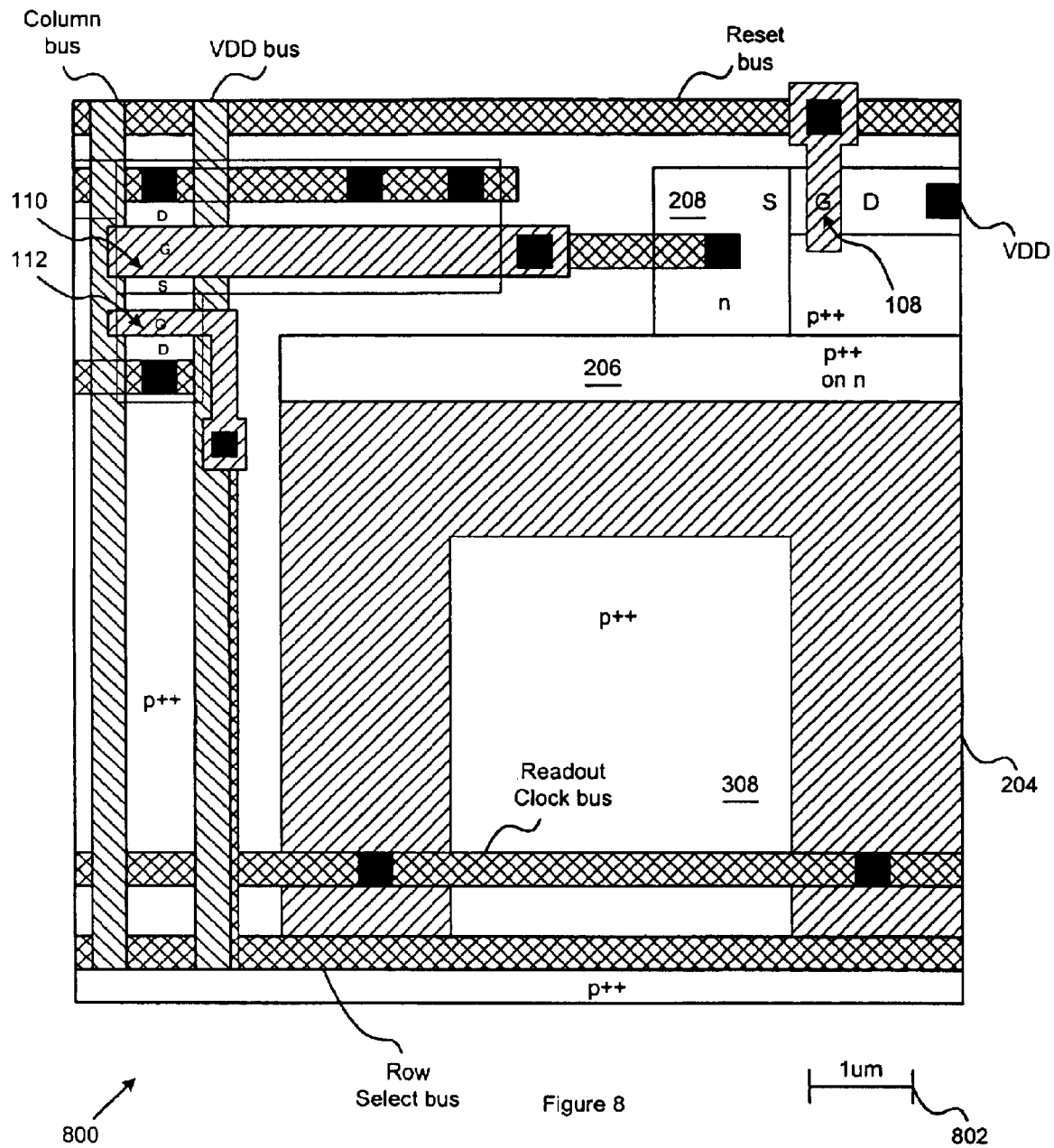
FIG. 8 shows an exemplary layout of a "poly hole" photoreceptor.

With regard next to FIG. 8, that figure shows a layout 800 of a "poly hole" photoreceptor. The layout 800 shows the location of the reset transistor 108, the output amplifier 110, and the select transistor 112. In addition, the layout 800 provides an exemplary layout for the photoreceptor 204, pinned transfer gate 206, and sense node 208. Note also the photoreceptor readout gate light aperture 308 or "poly hole" centrally disposed over the photoreceptor 204. The light aperture 308 need not be centrally positioned, however. Note that an approximate 1 micron scale 802 is present in FIG. 8. However, the dimensions of each structure may vary widely to suit the application to be implemented.

While various embodiments of the application have been described, it will be apparent to those of ordinary skill in the art that many more embodiments and implementations (e.g., using a different form or representation of quantization of the photoreceptor noise range) are possible that are within the scope of this invention. Accordingly, the invention is not to be restricted except in light of the attached claims and their equivalents.

What is claimed is:

1. An imager cell comprising:

a photoreceptor, wherein the photoreceptor comprises a photogate;

a sense node; and a pinned transfer gate formed by an implanted P type region within an implanted N type transfer region, the implanted P type region being pinned to a potential of a P type substrate, wherein the P type substrate surrounds the N type transfer region, and wherein the transfer gate is disposed to transfer charge between the photoreceptor and the sense node.

2. An imager cell comprising:

a photoreceptor, wherein the photoreceptor comprises a photodiode;

a sense node; and a pinned transfer gate formed by an implanted P type region within an implanted N type transfer region, the implanted P type region being pinned to a potential of a P type substrate, wherein the P type substrate surrounds the N type transfer region, and wherein the transfer gate is disposed to transfer charge between the photoreceptor and the sense node.

3. An imager cell comprising:

a photoreceptor;

a sense node;

a reset transistor disposed to reset the sense node; and a pinned transfer gate formed by an implanted P type region within an implanted N type transfer region, the implanted P type region being pinned to a potential of a P type substrate, wherein the P type substrate surrounds the N type transfer region, and wherein the transfer gate is disposed to transfer charge between the photoreceptor and the sense node.

4. An imager cell comprising:

a photoreceptor;

a sense node;

an output amplifier coupled to the sense node; and a pinned transfer gate formed by an implanted P type region within an implanted N type transfer region, the implanted P type region being pinned to a potential of a P type substrate, wherein the P type substrate surrounds the N type transfer region, and wherein the transfer gate is disposed to transfer charge between the photoreceptor and the sense node.

5. An imager cell as defined in claim 4, wherein the output amplifier is a source follower amplifier.

* * * * *